United States Patent
Choi et al.

(10) Patent No.: US 10,527,656 B2
(45) Date of Patent: Jan. 7, 2020

(54) METHOD FOR PREVENTING BATTERY OVERCHARGE AND OVERDISCHARGE AND INCREASING BATTERY EFFICIENCY

(71) Applicant: LG Chem, Ltd., Seoul (KR)

(72) Inventors: Hae In Choi, Daejeon (KR); Jung Soo Kang, Daejeon (KR); Young Bo Cho, Daejeon (KR); Gyong Jin Oh, Daejeon (KR); Jong Bum Lee, Chungcheongnam-Do (KR)

(73) Assignee: LG Chem, Ltd. (KR)

( * ) Notice: Subject to any disclaimer, the term of this patent is extended or adjusted under 35 U.S.C. 154(b) by 254 days.

(21) Appl. No.: 15/794,679

(22) Filed: Oct. 26, 2017

(65) Prior Publication Data

US 2018/0120361 A1     May 3, 2018

(30) Foreign Application Priority Data

Oct. 31, 2016    (KR) ........................ 10-2016-0143007

(51) Int. Cl.
| | |
|---|---|
| *H02J 7/00* | (2006.01) |
| *H01M 10/44* | (2006.01) |
| *G01R 19/00* | (2006.01) |
| *G01R 19/165* | (2006.01) |

(52) U.S. Cl.
CPC ...... *G01R 19/16542* (2013.01); *H01M 10/44* (2013.01); *H02J 7/0029* (2013.01); *H02J 7/0047* (2013.01); *H02J 2007/005* (2013.01); *H02J 2007/0037* (2013.01)

(58) Field of Classification Search
CPC ................ H02J 7/0029; H02J 7/0047; H02J 2007/0037; H02J 2007/005; H01M 10/44; G01R 19/16542
USPC ................ 320/134, 135, 156, 160, 161, 164
See application file for complete search history.

(56) References Cited

U.S. PATENT DOCUMENTS

| | | | | |
|---|---|---|---|---|
| 4,725,784 | A * | 2/1988 | Peled ................. | G01R 31/3648 324/427 |
| 9,063,018 | B1 * | 6/2015 | Ghantous ................. | G01K 1/14 |
| 9,950,620 | B1 * | 4/2018 | Hanna ....................... | B60T 1/10 |
| 2001/0017243 | A1 * | 8/2001 | Tajima ..................... | B66B 1/30 187/296 |

(Continued)

*Primary Examiner* — Phallaka Kik
(74) *Attorney, Agent, or Firm* — Lerner, David, Littenberg, Krumholz & Mentlik, LLP

(57) ABSTRACT

A battery power table setting method for using battery power efficiently and preventing battery overcharge includes: a first table generation operation for generating a first table by measuring a maximum charging power that prevents an output of a battery from being more than a maximum allowable voltage when the battery having a predetermined SOC value is charged at a predetermined temperature for a predetermined time; a second table generation operation for generating a second table by measuring an SOC value at the time point that the battery reaches the maximum allowable voltage when the battery is charged with a predetermined power value at a predetermined temperature; a third table generation operation for generating a third table by calculating a second maximum charging power according to a predetermined temperature and a predetermined SOC value based on the second table; and a derating table generation operation for generating a derating table.

11 Claims, 3 Drawing Sheets

(56) References Cited

U.S. PATENT DOCUMENTS

| | | | |
|---|---|---|---|
| 2005/0110466 A1* | 5/2005 | Shoji | G01R 31/3842 320/150 |
| 2010/0185405 A1* | 7/2010 | Aoshima | B60L 3/0046 702/63 |
| 2012/0143585 A1* | 6/2012 | Barsukov | G01R 31/367 703/18 |
| 2013/0154653 A1* | 6/2013 | Boehm | G01R 31/3647 324/426 |
| 2014/0009123 A1* | 1/2014 | Park | H02J 7/0052 320/152 |
| 2016/0380313 A1* | 12/2016 | Morita | H01M 10/486 429/50 |
| 2017/0123011 A1* | 5/2017 | Cha | G01R 27/02 |

* cited by examiner

METHOD FOR PREVENTING BATTERY OVERCHARGE AND OVERDISCHARGE AND INCREASING BATTERY EFFICIENCY

CROSS-REFERENCE TO RELATED APPLICATION

This application claims priority to Korean Patent Application No. 10-2016-0143007 filed on Oct. 31, 2016 and all the benefits accruing therefrom under 35 U.S.C. § 119, the contents of which are incorporated by reference in their entirety.

BACKGROUND

The present disclosure relates to a method for preventing overcharge and overdischarge of a battery and for increasing the efficiency of battery use.

More specifically, the present disclosure relates to a method for preventing overcharge and overdischarge of a battery and for increasing the efficiency of battery use by accurately setting a use range of the battery.

A general electric powered vehicle, a plug-in hybrid vehicle, a fuel cell vehicle, and the like are equipped with a high-voltage battery for driving an electric power component and perform discharge/charge according to the driving/braking state of the vehicle. A battery management system (BMS) monitors the internal temperature and the state of charge (SOC) of the high voltage battery in real time to control the optimal use area and the maximum input/output power through a controller.

At this time, the maximum charge/discharge power of the high voltage battery is limited in consideration of efficiency to the maximum power value of the driving system electric power component (e.g., motor/inverter) mounted on the vehicle, and the power value changes according to the internal temperature and the SOC of the high voltage battery.

Accordingly, in the present disclosure, a power table according to a temperature and an SOC is generated to increase the output efficiency of the battery and to prevent overcharge and overdischarge of the battery.

SUMMARY

The present disclosure provides a method for preventing overcharge and overdischarge of a battery and using the battery efficiently.

The present disclosure also provides a method for preventing overcharge and overdischarge of a battery and for increasing the efficiency of battery use by accurately setting a use range of the battery.

In accordance with an exemplary embodiment, 1. A battery power table setting method for using battery power efficiently and preventing battery overcharge includes: a first table generation operation for generating a first table by measuring a maximum charging power that prevents an output of a battery from being more than a maximum allowable voltage when the battery having a predetermined SOC value is charged at a predetermined temperature for a predetermined time; a second table generation operation for generating a second table by measuring an SOC value at the time point that the battery reaches the maximum allowable voltage when the battery is charged with a predetermined power value at a predetermined temperature; a third table generation operation for generating a third table by calculating a second maximum charging power according to a predetermined temperature and a predetermined SOC value based on the second table; a derating table generation operation for generating a derating table based on the first table and the third table; and a final power table generation operation for generating a final power table based on the first table and the derating table.

The predetermined time in the first table generation operation may be set to a short time within 10 seconds so that the temperature of the battery does not change while the battery is charged.

The derating table generation operation may generate a derating table by dividing a second maximum charging power value corresponding to each temperature and SOC value of the third table by a first maximum charging power value corresponding to each temperature and SOC value of the first table.

The final power table generation operation may further include: a derating minimum value detection operation for detecting a minimum value among derating values according to a temperature at a predetermined SOC value in the derating table; a fifth power table generation operation for multiplying the derating minimum value by the first power table to generate a fifth power table; and a sixth table generation operation for generating a sixth table that limits the charging power values of the fifth power table to a maximum charging allowable power according to the temperature of the battery preset when the battery is manufactured, wherein the final power table generation operation may generate a final power table by additionally setting a maximum charging limit power value suitable for a product in the sixth table.

In accordance with another exemplary embodiment, a battery power table setting method for using battery power efficiently and preventing battery overdischarge includes: a first table generation operation for generating a first table by measuring a maximum charging power that prevents an output of a battery from being less than a minimum allowable voltage when the battery having a predetermined SOC value is discharged at a predetermined temperature for a predetermined time; a second table generation operation for generating a second table by measuring an SOC value at the time point that the battery reaches the minimum allowable voltage when the battery is discharged with a predetermined power value at a predetermined temperature; a third table generation operation for generating a third table by calculating a second maximum charging power according to a predetermined temperature and a predetermined SOC value based on the second table; a derating table generation operation for generating a derating table based on the first table and the third table; and a final power table generation operation for generating a final power table based on the first table and the derating table.

The predetermined time in the first table generation operation may be set to a short time within 10 seconds so that the temperature of the battery does not change while the battery is discharged.

The derating table generation operation may generate a derating table by dividing a second maximum discharging power value corresponding to each temperature and SOC value of the third table by a first maximum discharging power value corresponding to each temperature and SOC value of the first table.

The final power table generation operation may further include: a derating minimum value detection operation for detecting a minimum value among derating values according to a temperature at a predetermined SOC value in the derating table; a fifth power table generation operation for multiplying the derating minimum value by the first power table to generate a fifth power table; and a sixth table generation operation for generating a sixth table that limits the discharging power values of the fifth power table to a maximum discharging allowable power according to the temperature of the battery preset when the battery is manufactured, wherein the final power table generation operation generates a final power table by additionally setting a product limit discharging power value suitable for a product in the sixth table.

In accordance with yet another exemplary embodiment, a battery power management system includes: a battery power table generation device; a battery management system (BMS) configured to control a battery; and a battery state measurement unit configured to measure a temperature and a state of charge (SOC) of the battery, wherein the battery power table generation device includes: a battery rechargeable power and dischargeable power measurement unit configured to measure a rechargeable power and a dischargeable power of the battery according to a predetermined temperature and a predetermined SOC; a table generation unit configured to generate first to third tables, a derating table, and a final power table based on values measured by the battery rechargeable power and dischargeable power measurement unit; and a memory configured to store the first to third tables, the derating table, and the final power table generated by the table generation unit, wherein the BMS controls charging and discharging of the battery based on the final power table generated by the battery power table generation device.

The table generation unit may include: a first table generation unit 110 configured to generate a first table by measuring a first maximum charging or discharging power that prevents an output of a battery from being more than a maximum allowable voltage or less than a minimum allowable voltage when the battery having a predetermined SOC value is charged or discharged at a predetermined temperature for a predetermined time; a second table generation unit configured to generate a second table by measuring an SOC value at the time point that an output of the battery reaches the maximum allowable voltage or the minimum allowable voltage when the battery is charged or discharged with a predetermined power value at a predetermined temperature; a third table generation unit configured to generate a third table by calculating a second maximum charging or discharging power according to a predetermined temperature and a predetermined SOC value based on the second table; a derating table generation unit configured to generate a derating table based on the first table and the third table; and a final power table generation unit configured to generate a final power table based on the first table and the derating table.

The final power table generation unit may include: a derating minimum value detection unit configured to detect a minimum value among derating values according to a temperature at a predetermined SOC value in the derating table; a fifth table generation unit configured to generate a fifth table by multiplying the derating minimum value by the first power table; and a sixth table generation unit configured to generate a sixth table that limits the charging or discharging power values of the fifth table to a maximum charging or discharging allowable power value according to the temperature of the battery preset when the battery is manufactured, wherein the sixth table may be set as the final power table by limiting the charging or discharging power of the battery based on the maximum charging or discharging allowable power value of a product where the battery is used.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
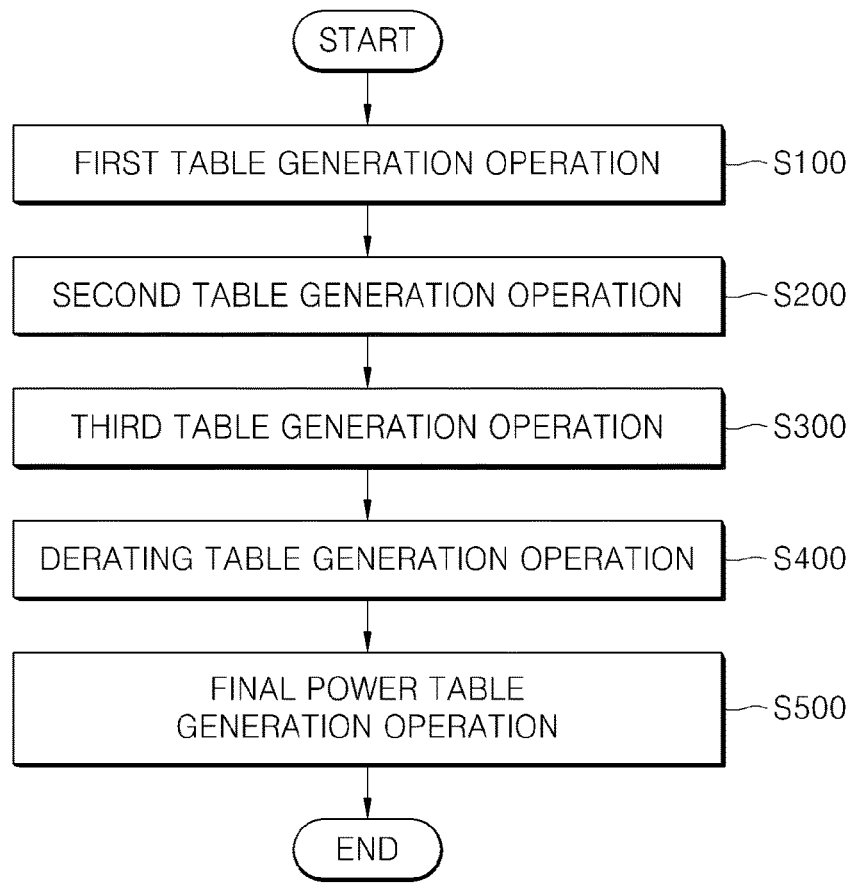
FIG. 1 is an entire flowchart according to an embodiment of the present disclosure.

Hereinafter, embodiments of the present disclosure will be described in detail with reference to the accompanying drawings so that those skilled in the art can easily carry out the present disclosure. The present disclosure may, however, be embodied in different forms and should not be constructed as limited to the embodiments set forth herein. Parts not relating to description are omitted in the drawings in order to clearly describe the present disclosure and like reference numerals refer to like elements throughout.

Although the terms "first," "second," etc., may be used herein to describe various elements, these elements should not be limited by these terms. The above terms are used only to distinguish one component from another. For example, a first component may be referred to as a second component and vice versa without departing from the scope of the present disclosure. Terms used in this specification are used to describe specific embodiments, and are not intended to limit the scope of the present disclosure. The singular expressions include plural expressions unless the context clearly dictates otherwise.

Throughout the specification, when a portion is referred to as being "connected" to another portion, it includes not only "directly connected" but also "electrically connected" with another element therebetween. Furthermore, when it is described that one comprises (or includes or has) some elements, it should be understood that it may comprise (or include or has) only those elements, or it may comprise (or include or have) other elements as well as those elements if there is no specific limitation. The term "~ing operation" or "operation of ~ing" used throughout the specification does not mean "operation for ~ing".

Terms used in this specification may be currently widely used general terms in consideration of functions in the present disclosure but may vary according to the intents of those skilled in the art, precedents, or the advent of new technology. Additionally, in certain cases, there may be terms the applicant selects arbitrarily and in this case, their meanings are described in a corresponding description part of the present disclosure. Accordingly, terms used in the present disclosure should be defined based on the meaning of the term and the entire contents of the present disclosure instead of the simple term name.

When it is described in the entire specification that one part "includes" some elements, it means that the one part may include only those elements, or include other elements as well as those elements if there is no specific limitation.

Figure 2:
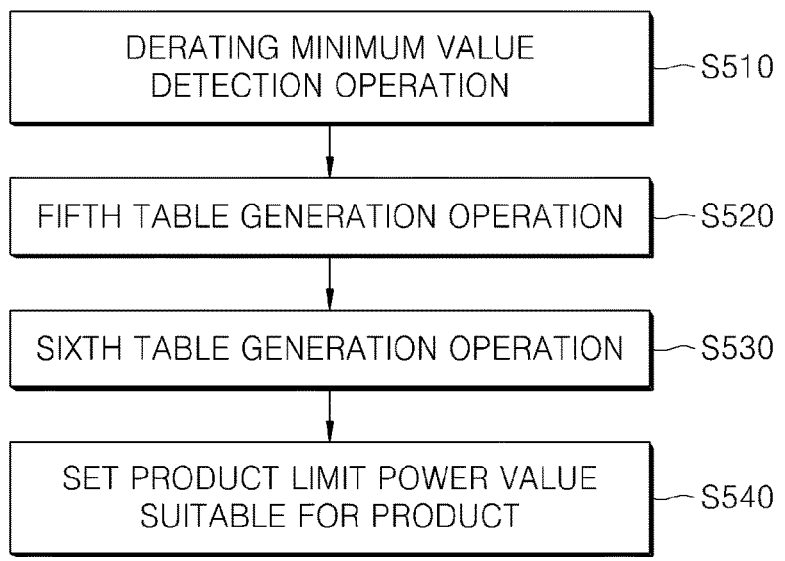
FIG. 2 is a detailed flowchart of a final power table generation operation according to an embodiment of the present disclosure.
Figure 3:
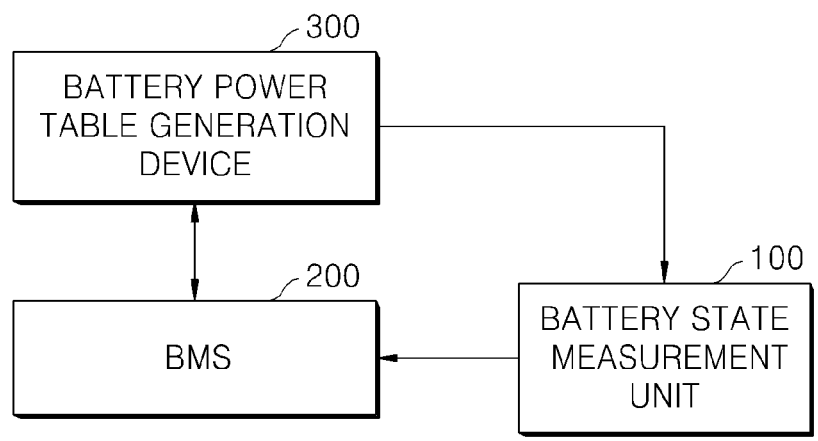
FIG. 3 is an entire configuration diagram of a battery power management system according to an embodiment of the present disclosure.
Figure 4:
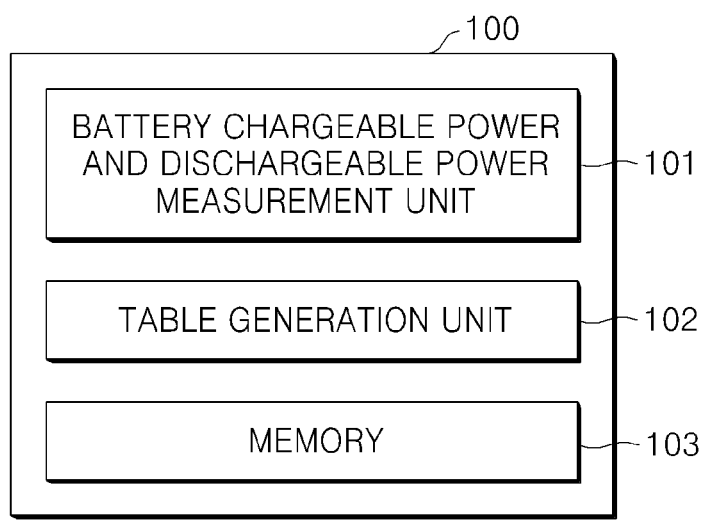
FIG. 4 is a detailed configuration diagram of a battery power table generation device according to an embodiment of the present disclosure.
Figure 5:
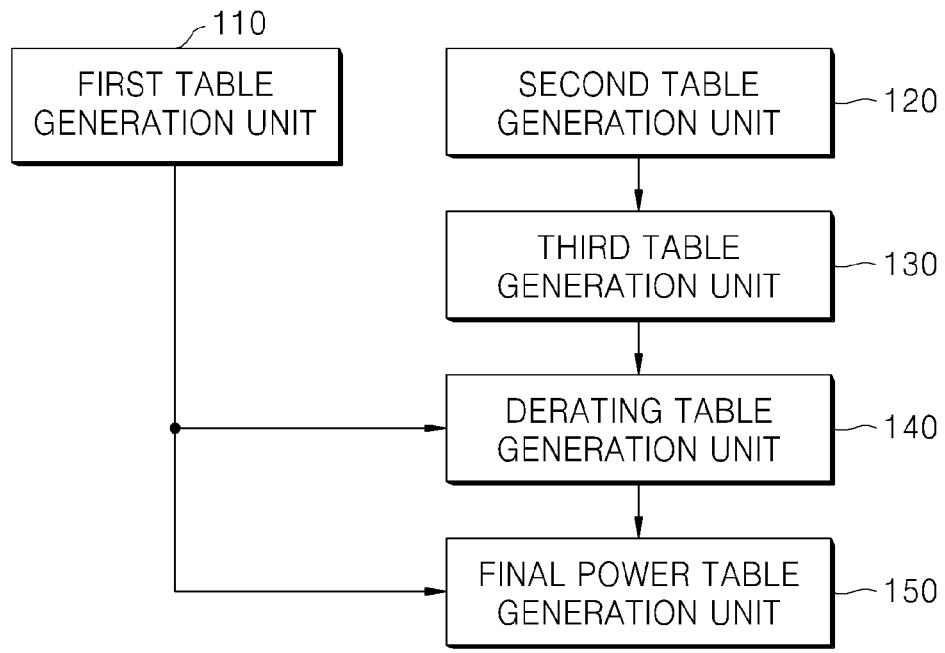
FIG. 5 is a detailed configuration diagram of a table generation unit according to an embodiment of the present disclosure.
Figure 6:
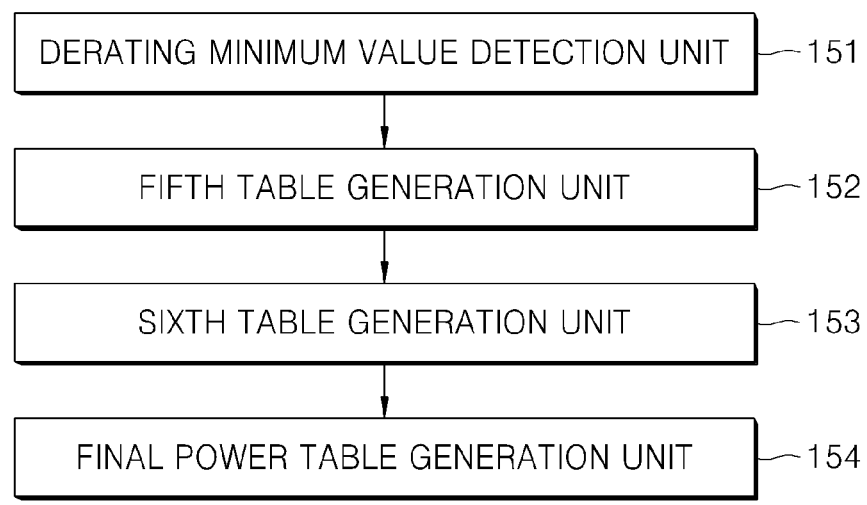
FIG. 6 is a detailed configuration diagram of a final power table generation unit according to an embodiment of the present disclosure.

Hereinafter, a method of generating a power table according to an embodiment of the present disclosure will be described with reference to FIGS. 1 and 2.

Embodiment 1

Hereinafter, a method of generating a power table according to an embodiment of the present disclosure will be described with reference to FIGS. 1 and 2.

1. Method of Generating Battery Power Table During Charging According to Present Disclosure.

A battery power table generation method according to an embodiment of the present disclosure includes a first table generation operation (S100) for generating a first table by measuring a maximum charging power that prevents an output of a battery from being more than a maximum allowable voltage when the battery having a predetermined SOC value is charged at a predetermined temperature for a predetermined time, a second table generation operation (S200) for generating a second table by measuring an SOC value at the time point that the battery reaches the maximum allowable voltage when the battery is charged with a predetermined power value at a predetermined temperature, a third table generation operation (S300) for generating a third table by calculating a maximum charging power according to a predetermined temperature and a predetermined SOC value based on the second table, a derating table generation operation (S400) for generating a derating table based on the first table and the third table, and a final power table generation operation (S500) for generating a final power table based on the first table and the derating table.

1-1. First Table Generation Operation of Present Disclosure

More specifically, the first table generation operation (S100) measures an OCV value according to the SOC value of the battery at a predetermined temperature, and measures a first maximum charging power chargeable to the battery from the OCV value according to the SOC value of the battery until an output voltage of the battery reaches the maximum allowable voltage to generate the first table.

Meanwhile, it can be said that the first table is a value measured by setting the time until the output voltage of the battery reaches the maximum allowable voltage to be less than 10 seconds, and there is no temperature change of the battery.

Table 1 below is a concrete embodiment of the first table during charging.

TABLE 1

| Tem-<br>perature | SOC | | | | | | | | |
|---|---|---|---|---|---|---|---|---|---|
| | 95 | 90 | 85 | 80 | 75 | 70 | 65 | 60 | ... |
| −10 | 36 | 73 | 109 | 145 | 181 | 218 | 239 | 255 | |
| 0 | 87 | 175 | 218 | 261 | 300 | 339 | 375 | 411 | |
| 15 | 291 | 364 | 496 | 629 | 739 | 848 | 968 | 1088 | |
| 25 | A: 439 | 555 | 787 | 958 | 1133 | 1308 | 1464 | 1620 | |
| 35 | 551 | 702 | 958 | 1214 | 1439 | 1663 | 1890 | 2117 | |
| 45 | 662 | 847 | 1157 | 1467 | 1740 | 2013 | 2336 | 2658 | |

The value in A in the above table may mean that the maximum charging power that can be charged until the maximum voltage is reached when charging a battery having a SOC value of 95 at 25 degrees is 439.

1-2. Second Table Generation Operation of Present Disclosure

Meanwhile, the second table generation operation (S200) may generate the second table by measuring the SOC value at the time point that the battery reaches the maximum allowable voltage while charging the battery having an SOC of 0 at a temperature, which can be a separate value independent of the temperature measured in the first table.

More specifically, the predetermined power value may be a CP rate, which is a value set when the battery is designed.

On the other hand, Table 2 below is a concrete embodiment of the second table during charging.

TABLE 2

| Power | Temperature | | | | | | | | |
|---|---|---|---|---|---|---|---|---|---|
| (CP rate) | −10 | −5 | 0 | 5 | 10 | 15 | 20 | 25 | ... |
| 466.2 (2) | 80.14 | 79.28 | 83.62 | 85.16 | 86.25 | 87.10 | 87.57 | 88.92 | |
| 233.1 (1) | 82.02 | 82.65 | 86.14 | 88.16 | 89.53 | 87.95 | 92.25 | B: 93.12 | |
| 174.825 (0.75) | 83.86 | 84.35 | 87.62 | 89.39 | 90.58 | 93.67 | 95.08 | C: 95.94 | |
| 116.55 (0.5) | 83.78 | 87.22 | 89.45 | 90.00 | 93.29 | 95.17 | 96.33 | 96.83 | |
| 77.7 (0.33) | 85.77 | 88.34 | 97.07 | 92.83 | 94.75 | 96.33 | 97.00 | 97.72 | |
| 58.275 (0.25) | 87.03 | 89.58 | 92.40 | 94.00 | 95.16 | 97.30 | 97.89 | 98.42 | |
| 46.62 (0.2) | 88.23 | 91.32 | 93.70 | 95.40 | 96.62 | 97.79 | 98.40 | 98.79 | |

The value of the point B in Table 2 above may mean that when the battery is charged at a battery temperature of 25 with a charging power value of 233.1 (1 CP rate), the SOC value at the time point that the battery reaches the maximum allowable voltage is 93.12, and the value of the point C may mean that when the battery is charged at a battery temperature of 25 with a charging power value of 174.825 (0.75 CP rate), the SOC value is 95.94 at the time point that the battery reaches the maximum allowable voltage.

1-3. Third Table Generation Operation of Present Disclosure

On the other hand, the third table generation operation (S300) may generate the third power table based on the second table that measures the amount of charge at the time point that the battery reaches the maximum allowable voltage when the battery is charged with the temperature and the predetermined power value.

That is, the third table may be a table that calculates the second maximum charging power using the temperature and the value of the SOC as variables based on the second table having the temperature and the predetermined power value during charging as variables.

A more specific calculation method may calculate the charging power according to the value of the SOC based on the correlation between the charging power at the points B and C in Table 2 and the SOC value at the time point that the maximum permissible voltage is reached.

On the other hand, Table 3 below is a concrete embodiment of the third table during charging.

TABLE 3

| Tem-perature | Charging amount (SOC) | | | | | | | |
|---|---|---|---|---|---|---|---|---|
| | 95 | 90 | 85 | 80 | 75 | 70 | 65 | 60 ... |
| −10 | 20 | 40 | 93 | 466 | 466 | 466 | 466 | 466 |
| 0 | 37 | 103 | 338 | 466 | 466 | 466 | 466 | 466 |
| 15 | 123 | 212 | 466 | 466 | 466 | 466 | 466 | 466 |
| 25 | D: 194 | 406 | 466 | 466 | 466 | 466 | 466 | 466 |
| 35 | 261 | 466 | 466 | 466 | 466 | 466 | 466 | 466 |
| 45 | 303 | 466 | 466 | 466 | 466 | 466 | 466 | 466 |

In Table 3, the value at the point D may mean that the chargeable power amount of the battery having a charging amount of 95 at a temperature of 25 to the maximum allowable voltage is 194.

1-4. Derating Table Generation Operation of Present Disclosure

Meanwhile, the derating table generation operation (S400) may generate a derating table by dividing a value corresponding to the temperature and the SOC value of the first table by a value corresponding to the temperature and the SOC value of the third power table.

Table 4 below is a concrete embodiment of the derating table during charging.

TABLE 4

| Tem-perature | SOC | | | | | | | |
|---|---|---|---|---|---|---|---|---|
| | 95 | 90 | 85 | 80 | 75 | 70 | 65 | 60 ... |
| −10 | 0.56 | 0.55 | 0.85 | 3.21 | 2.57 | 2.14 | 1.95 | 1.83 |
| 0 | 0.43 | 0.59 | 1.55 | 1.79 | 1.55 | 1.37 | 1.24 | 1.13 |
| 15 | 0.42 | 0.58 | 0.94 | 0.74 | 0.63 | 0.55 | 0.48 | 0.43 |
| 25 | D: 0.44 | 0.73 | 0.59 | 0.49 | 0.41 | 0.36 | 0.32 | 0.29 |
| 35 | 0.47 | 0.66 | 0.49 | 0.38 | 0.32 | 0.28 | 0.25 | 0.22 |
| 45 | 0.46 | 0.55 | 0.40 | 0.32 | 0.27 | 0.23 | 0.20 | 0.18 |

In Table 4, the E point may be a value obtained by dividing the value of the D point in Table 3 above by the value of the A point in Table 1 above.

1-5. Final Power Table Generation Operation of Present Disclosure

Meanwhile, the final power table generation operation (S500) further includes a derating minimum value detection operation (S510) for detecting a minimum value among derating values according to a temperature at a predetermined SOC value in the derating table, a fifth power table generation operation (S520) for multiplying the derating minimum value by the first power table to generate a fifth power table, and a sixth table generation operation (S530) for generating a sixth table that limits the values of the fifth power table to a maximum allowable power according to a predetermined temperature of a battery cell, and may generate a final power table by setting the sixth table to the maximum allowable power value suitable for a product (S540).

Table 5 below is a specific embodiment of the fifth table generation operation (S520) generated by multiplying the first power table of Table 1 and the derating table of Table 4 during charging.

TABLE 5

| Tem-perature | SOC | | | | | | | |
|---|---|---|---|---|---|---|---|---|
| | 95 | 90 | 85 | 80 | 75 | 70 | 65 | 60 ... |
| −10 | 20 | 40 | 60 | 58 | 73 | 87 | 96 | 103 |
| 0 | 37 | 103 | 140 | 105 | 121 | 136 | 151 | 165 |
| 15 | 122 | 211 | 466 | 253 | 297 | 341 | 389 | 437 |
| 25 | E:193 | 405 | 488 | 385 | 455 | 526 | 588 | 651 |
| 35 | 259 | 463 | 469 | 488 | 578 | 668 | 759 | 851 |
| 45 | 305 | 466 | 489 | 589 | 699 | 809 | 938 | 1068 |

The point E may be the chargeable battery maximum power value in an SOC of 95 at 25 degrees calculated by multiplying the point A in Table 1 and the point D in Table 4.

Table 6 below is a specific embodiment of the sixth power table generation operation (S530) in which the maximum allowable power range according to the temperature of the battery of the fifth table is 350 during charging.

TABLE 6

| Tem-perature | SOC | | | | | | | |
|---|---|---|---|---|---|---|---|---|
| | 95 | 90 | 85 | 80 | 75 | 70 | 65 | 60 ... |
| −10 | 20 | 40 | 60 | 58 | 73 | 87 | 96 | 103 |
| 0 | 37 | 103 | 140 | 105 | 121 | 136 | 151 | 165 |
| 15 | 122 | 211 | 350 | 253 | 297 | 341 | 350 | 350 |
| 25 | 193 | 223 | 350 | 350 | 350 | 350 | 350 | 350 |
| 35 | 259 | 350 | 350 | 350 | 350 | 350 | 350 | 350 |
| 45 | 225 | 350 | 350 | 350 | 350 | 350 | 350 | 350 |

Referring to Table 6, values of 350 or more in Table 5 may be changed to 350.

Meanwhile, in Table 6, in the case that the maximum power range according to the temperature of the battery is 350 but the maximum allowable power of an electronic device to which the battery is actually connected is 250, the power of the battery is additionally set to 250, which is a product limit power value.

TABLE 7

| Tem-perature | SOC | | | | | | | |
|---|---|---|---|---|---|---|---|---|
| | 95 | 90 | 85 | 80 | 75 | 70 | 65 | 60 ... |
| −10 | 20 | 40 | 60 | 58 | 73 | 87 | 96 | 103 |
| 0 | 37 | 103 | 140 | 105 | 121 | 136 | 151 | 165 |
| 15 | 122 | 211 | 250 | 250 | 250 | 250 | 250 | 250 |
| 25 | 193 | 223 | 250 | 250 | 250 | 250 | 250 | 250 |
| 35 | 250 | 250 | 250 | 250 | 250 | 250 | 250 | 250 |
| 45 | 225 | 250 | 250 | 250 | 250 | 250 | 250 | 250 |

Referring to Table 7, it is possible to change chargeable power values less than 350 and greater than 250 to 250 in Table 6.

After the above-described process is completed, it is possible to determine that the battery power table is normally set if the measured charging power has a value within an error range by measuring the charging power of the battery through the actual battery power test.

On the other hand, if the measured charging power has a value outside the error range, it is possible to correct the calculated derating value in the derating table and repeatedly perform the final power table generation operation based on the corrected derating value.

On the other hand, based on the generated final power table of the battery, the maximum charging power of the battery is limited and operated according to the temperature and the SOC value of the battery cell in the BMS, thereby improving the efficiency of the battery and preventing the overcharge of the battery to keep the state of the battery healthy.

Embodiment 2

2. Battery Power Table Generation Method of Present Disclosure During Discharging Next, a power table generation method during battery discharging according to another embodiment of the present disclosure will be described.

The battery power table generation method during battery discharging according to another embodiment of the present disclosure proceeds through the same procedure as that performed in the power table generation method during the battery charging.

However, in the first table generation operation (S100), the battery power consumed while the output voltage of the battery reaches the minimum allowable voltage in the battery having the predetermined temperature and SOC may be measured to generate a table as shown in Table 1 above.

On the other hand, in the second table generation operation (S200) during discharging, the SOC value at the time point that the output voltage of the battery reaches the minimum allowable voltage while discharging the battery with a predetermined temperature and an SOC of 100 may be measured to generate a table as shown in Table 2.

Thereafter, the battery power table generation method during discharging performs the third table generation operation (S300), the derating table generation operation (S400), and the final power table generation operation (S500) of the above-mentioned power table generation method during charging to generate a battery power table during discharging.

Embodiment 3

3. Battery Power Management System According to Embodiment of Present Disclosure Next, a battery power management system for controlling charge/discharge power by generating a power table during charging/discharging will be described as an embodiment of the present disclosure.

FIGS. 3 to 6 are configuration diagrams of a battery power management system according to an embodiment of the present disclosure.

Hereinafter, a battery power management system according to an embodiment of the present disclosure will be described with reference to FIGS. 3 to 6.

The battery power management system of the present disclosure may include a battery power table generation device 100, a BMS 200 for controlling a battery, and a battery state measurement unit 300 for measuring a temperature and an SOC of the battery.

More specifically, the battery power table generation device (100) includes a battery rechargeable power and dischargeable power measurement unit 101 for measuring a rechargeable power and a dischargeable power of the battery according to a predetermined temperature and a predetermined SOC, a table generation unit 102 for generating first to third tables, a derating table, and a final power table based on values measured by the battery rechargeable power and dischargeable power measurement unit 101, and a memory 103 for storing the first to third tables, the derating table, and the final power table generated by the table generation unit 102.

On the other hand, the table generation unit 102 may include a first table generation unit 110 for generating a first table by measuring a first maximum charging or discharging power that prevents an output of a battery from being more than a maximum allowable voltage or less than a minimum allowable voltage when the battery having a predetermined SOC value is charged or discharged at a predetermined temperature for a predetermined time, a second table generation unit 120 for generating a second table by measuring an SOC value at the time point that an output of the battery reaches the maximum allowable voltage or the minimum allowable voltage when the battery is charged or discharged with a predetermined power value at a predetermined temperature, a third table generation unit 130 for generating a third table by calculating a second maximum charging or discharging power according to a predetermined temperature and a predetermined SOC value based on the second table, a derating table generation unit 140 for generating a derating table based on the first table and the third table, and a final power table generation unit 150 for generating a final power table based on the first table and the derating table.

Meanwhile, the final power table generation unit 150 may include a derating minimum value detection unit 151 for detecting a minimum value among derating values according to a temperature at a predetermined SOC value in the derating table, a fifth table generation unit 152 for generating a fifth power table by multiplying the derating minimum value by the first power table, and a sixth table generation unit 153 for generating a sixth table that limits the charging or discharging power values of the fifth table to a maximum charging or discharging allowable power value according to the temperature of the battery preset when the battery is manufactured, and the sixth table may set as the final power table 154 by limiting the charging or discharging power of the battery based on the maximum charging or discharging allowable power value of a product where the battery is used.

On the other hand, the BMS controls charging and discharging of the battery based on the final power table generated in the battery power table generation device, thereby enabling more efficient use of the battery power and preventing overcharge and overdischarge.

According to the present disclosure, by precisely setting the use range of the battery, it is possible to maintain the state of the battery well, to prevent overcharge and overdischarge, and to improve the use efficiency of the battery.

Although the method for preventing overcharge and overdischarge of a battery and for increasing the efficiency of battery use has been described with reference to the specific embodiments, it is not limited thereto. Therefore, it will be readily understood by those skilled in the art that various modifications and changes can be made thereto without departing from the spirit and scope of the present disclosure defined by the appended claims.

What is claimed is:

1. A battery power table setting method for using battery power efficiently and preventing battery overcharge, the method comprising:
   a first table generation operation for generating a first table by measuring a maximum charging power that prevents an output of a battery from being more than a maximum allowable voltage when the battery having a predetermined SOC value is charged at a predetermined temperature for a predetermined time;

a second table generation operation for generating a second table by measuring an SOC value at the time point that the battery reaches the maximum allowable voltage when the battery is charged with a predetermined power value at a predetermined temperature;

a third table generation operation for generating a third table by calculating a second maximum charging power according to a predetermined temperature and a predetermined SOC value based on the second table;

a derating table generation operation for generating a derating table based on the first table and the third table; and a final power table generation operation for generating a final power table based on the first table and the derating table.

2. The method of claim 1, wherein the predetermined time in the first table generation operation is set to a short time within 10 seconds so that the temperature of the battery does not change while the battery is charged.

3. The method of claim 1, wherein the derating table generation operation generates a derating table by dividing a second maximum charging power value corresponding to each temperature and SOC value of the third table by a first maximum charging power value corresponding to each temperature and SOC value of the first table.

4. The method of claim 1, wherein the final power table generation operation further comprises:

a derating minimum value detection operation for detecting a minimum value among derating values according to a temperature at a predetermined SOC value in the derating table;

a fifth power table generation operation for multiplying the derating minimum value by the first power table to generate a fifth power table; and a sixth table generation operation for generating a sixth table that limits the charging power values of the fifth power table to a maximum charging allowable power according to the temperature of the battery preset when the battery is manufactured, wherein the final power table generation operation generates a final power table by additionally setting a maximum charging limit power value suitable for a product in the sixth table.

5. A battery power table setting method for using battery power efficiently and preventing battery overdischarge, the method comprising:

a first table generation operation for generating a first table by measuring a maximum charging power that prevents an output of a battery from being less than a minimum allowable voltage when the battery having a predetermined SOC value is discharged at a predetermined temperature for a predetermined time;

a second table generation operation for generating a second table by measuring an SOC value at the time point that the battery reaches the minimum allowable voltage when the battery is discharged with a predetermined power value at a predetermined temperature;

a third table generation operation for generating a third table by calculating a second maximum charging power according to a predetermined temperature and a predetermined SOC value based on the second table;

a derating table generation operation for generating a derating table based on the first table and the third table; and a final power table generation operation for generating a final power table based on the first table and the derating table.

6. The method of claim 5, wherein the predetermined time in the first table generation operation is set to a short time within 10 seconds so that the temperature of the battery does not change while the battery is discharged.

7. The method of claim 5, wherein the derating table generation operation generates a derating table by dividing a second maximum discharging power value corresponding to each temperature and SOC value of the third table by a first maximum discharging power value corresponding to each temperature and SOC value of the first table.

8. The method of claim 5, wherein the final power table generation operation further comprises:

a derating minimum value detection operation for detecting a minimum value among derating values according to a temperature at a predetermined SOC value in the derating table;

a fifth power table generation operation for multiplying the derating minimum value by the first power table to generate a fifth power table; and a sixth table generation operation for generating a sixth table that limits the discharging power values of the fifth power table to a maximum discharging allowable power according to the temperature of the battery preset when the battery is manufactured, wherein the final power table generation operation generates a final power table by additionally setting a product limit discharging power value suitable for a product in the sixth table.

9. A battery power management system comprising:

a battery power table generation device;

a battery management system (BMS) configured to control a battery; and a battery state measurement unit configured to measure a temperature and a state of charge (SOC) of the battery, wherein the battery power table generation device comprises:

a battery rechargeable power and dischargeable power measurement unit configured to measure a rechargeable power and a dischargeable power of the battery according to a predetermined temperature and a predetermined SOC;

a table generation unit configured to generate first to third tables, a derating table, and a final power table based on values measured by the battery rechargeable power and dischargeable power measurement unit; and a memory configured to store the first to third tables, the derating table, and the final power table generated by the table generation unit, wherein the BMS controls charging and discharging of the battery based on the final power table generated by the battery power table generation device.

10. The system of claim 9, wherein the table generation unit comprises:

a first table generation unit 110 configured to generate a first table by measuring a first maximum charging or discharging power that prevents an output of a battery from being more than a maximum allowable voltage or less than a minimum allowable voltage when the battery having a predetermined SOC value is charged or discharged at a predetermined temperature for a predetermined time;

a second table generation unit configured to generate a second table by measuring an SOC value at the time point that an output of the battery reaches the maximum allowable voltage or the minimum allowable voltage when the battery is charged or discharged with a predetermined power value at a predetermined temperature;

a third table generation unit configured to generate a third table by calculating a second maximum charging or discharging power according to a predetermined temperature and a predetermined SOC value based on the second table;

a derating table generation unit configured to generate a derating table based on the first table and the third table; and a final power table generation unit configured to generate a final power table based on the first table and the derating table.

11. The system of claim 10, wherein the final power table generation unit comprises:

a derating minimum value detection unit configured to detect a minimum value among derating values according to a temperature at a predetermined SOC value in the derating table;

a fifth table generation unit configured to generate a fifth table by multiplying the derating minimum value by the first power table; and a sixth table generation unit configured to generate a sixth table that limits the charging or discharging power values of the fifth table to a maximum charging or discharging allowable power value according to the temperature of the battery preset when the battery is manufactured, wherein the sixth table is set as the final power table by limiting the charging or discharging power of the battery based on the maximum charging or discharging allowable power value of a product where the battery is used.

* * * * *